(12) United States Patent
Yu

(10) Patent No.: US 6,274,469 B1
(45) Date of Patent: Aug. 14, 2001

(54) PROCESS USING A PLUG AS A MASK FOR A GATE

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/490,805

(22) Filed: Jan. 26, 2000

(51) Int. Cl.[7] .................... H01L 21/338; H01L 21/4763
(52) U.S. Cl. ..................... 438/592; 438/142; 438/180
(58) Field of Search ........................... 438/142, 197, 438/299, 301, 306, 167, 180, 181, 182, 184, 185, 186, 199, 216, 229, 230, 231, 232, 584, 585, 591, 592, 595

(56) References Cited

U.S. PATENT DOCUMENTS

Re. 36,305 * 9/1999 Dennison .
5,162,884 * 11/1992 Liou et al. .
5,330,879 * 7/1994 Dennsion .

* cited by examiner

Primary Examiner—Charles Bowers
Assistant Examiner—Evan Pert
(74) Attorney, Agent, or Firm—Foley & Lardner

(57) ABSTRACT

A method of fabricating an integrated circuit with a gate structure comprised of an oxide/polysilicon/metal stack. The method includes forming the gate structure by using a metal plug as a hard mask in place of a hard mask produced using photolithography. Thus, linewidth limitations of conventional photolithography do not apply. Specifically, the method includes providing a pattern over a semiconductor substrate; partially filling the pattern with a polysilicon material such that a trench is left in the polysilicon material, and filling the trench in the polysilicon material with metal to form a plug. After forming the materials, excess materials are removed leaving the gate structure.

20 Claims, 6 Drawing Sheets

PROCESS USING A PLUG AS A MASK FOR A GATE

FIELD OF THE INVENTION

The present invention relates to integrated circuits and methods of manufacturing integrated circuits. More particularly, the present invention relates to a maskless method of manufacturing an integrated circuit.

BACKGROUND OF THE INVENTION

Integrated circuits (ICs) include many transistors formed on a single semiconductor substrate. As IC technology has progressed, the density of transistors formed on a single semiconductor substrate has increased rapidly. Currently, ICs such as ultra-large scale integrated (ULSI) circuits can include more than a million transistors. To allow continued increase in both the number of transistors and the density of transistors on an integrated circuit, new methods of fabricating ICs must be developed.

Traditional fabrication methods utilize conventional optical lithography techniques to define transistors over a semiconductor substrate. Conventional optical lithography includes the following steps: (1) forming a photoresist material over a nitride layer, (2) exposing areas of the photoresist to radiation through a mask containing a transistor pattern, (3) developing the photoresist such that it becomes soluble to a specific solvent at locations where the transistors are to be located, (4) removing the developed photoresist to expose the transistor areas on the nitride layer, and (5) removing the nitride layer at locations exposed through the photoresist layer. After optical lithography, active regions for transistors can be provided through voids in the nitride layer formed by lithography.

Figure 1:
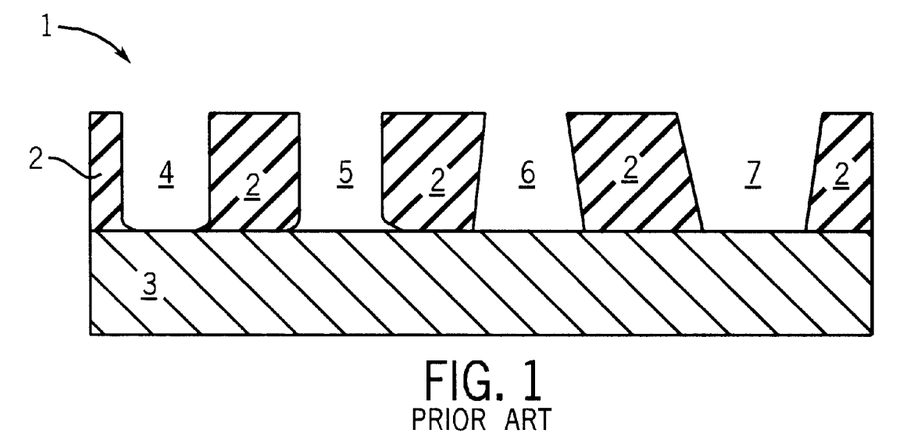
FIG. 1 is a cross-sectional view of a portion of an integrated circuit showing limitations associated with the prior art.

While providing a valuable method of defining transistor areas over a semiconductor substrate, conventional optical lithography has various limitations. For example, during the exposure step, areas outside of the transistor areas are unintentionally exposed to reflected radiation. This uncontrolled exposure to reflected radiation limits transistor pattern precision and, ultimately, transistor density. FIG. 1, a cross-sectional view of pattern imprecision resulting from reflected radiation, shows a portion 1 of an integrated circuit including a nitride layer 2 and an underlying layer 3. Portion 1 illustrates various problems resulting from conventional optical lithography. Specifically, four undesirable characteristics of apertures in the nitride layer are illustrated: (1) a footed aperture 4, (2) an undercut aperture 5, (3) a re-entrant aperture 6, and (4) a tapered aperture 7. The unpredictable and undesirable aperture characteristics shown in portion 1 limit transistor density. Although the problems shown on portion 1 in FIG. 1 are shown on one substrate, only one or two types of problems are typically present on any one substrate.

The imprecision of conventional optical lithography represents a barrier to continuous scaling of MOS transistors to a 0.05 um generation and below. Where IC fabrication requires patterning of gate lines with very small dimensions (e.g., 10–30 nm), use of conventional optical lithography will be very difficult or even impossible.

Thus, there is a need for a non-lithographic or "maskless" process for fabricating small dimension transistors. Further still, there is a need to minimize gate sheet resistance in the transistors formed using the maskless process. Gate sheet resistance should be minimized as RC delay is considered one of the most important factors that impact circuit performance. (e.g., circuit speed).

SUMMARY OF THE INVENTION

An embodiment relates to a method of manufacturing an integrated circuit. The method includes providing a semiconductor substrate and a patterned layer over the substrate. The patterned layer includes at least one pattern aperture through which an active area of the substrate is exposed. The method also includes forming a first material over the patterned layer. By forming the first material over the patterned layer, the pattern aperture is partially filled with the first material and a trench is formed in the first material that corresponds to the location of the pattern aperture. Further, the method includes forming a second material over the first material, such that a plug is formed where the second material substantially fills the trench. The method also includes removing a portion of the second material such that the plug remains in the trench and provides a hard mask for a gate conductor.

Another embodiment further relates to a maskless method of forming a gate structure for a transistor on an integrated circuit. The method includes providing a semiconductor substrate and a first material disposed over the substrate such that a trench is formed in the first material. The trench is substantially filled with a second material to form a plug which provides a hard mask. The method further includes removing a portion of the first material such that first material which is not below the plug is removed. Using the method, a gate structure including the plug and the first material is formed over the substrate.

Yet another embodiment further relates to a transistor gate structure formed without an optical lithography mask by using a metal plug as a hard mask. The gate structure includes an oxide layer disposed over a semiconductor material, a polysilicon gate conductor disposed over the oxide layer, and a metal layer disposed over the gate conductor.

BRIEF DESCRIPTION OF THE DRAWINGS

Preferred exemplary embodiments are described below with reference to the accompanying drawings wherein like numerals denote like elements, and.

DETAILED DESCRIPTION OF THE PREFERRED EXEMPLARY EMBODIMENTS

Figure 2:
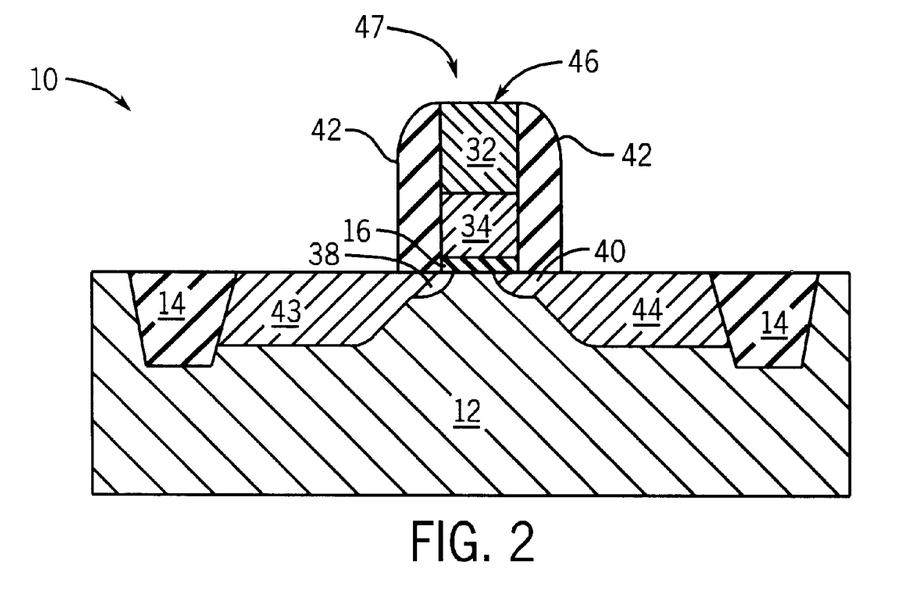
FIG. 2 is a cross-sectional view of a portion of an integrated circuit showing a transistor formed according to an exemplary embodiment.

With reference to FIG. 2, a portion 10 of an integrated circuit includes a transistor portion 47 disposed on a semiconductor substrate 12, such as, a single crystal silicon wafer. Transistor portion 47 includes a gate structure 46, a source region 43, a drain region 44, a shallow source extension 38, and a shallow drain extension 40. In addition, transistor portion 47 can be provided between two insulative structures 14, which can be shallow trench isolation structures or local oxidation of silicon (LOCOS) structures.

Extensions 38 and 40 are preferably ultra-shallow extensions (e.g., junction depth is less than 30 nanometers (nm)), which are thinner than regions 43 and 44. Extensions 38 and 40 are connected to regions 43 and 44, respectively, and are disposed partially underneath a gate oxide 16. Ultra-shallow extensions 38 and 40 help transistor 47 achieve substantial immunity to short-channel effects. Short-channel effects can degrade performance of transistor 47 as well as the manufacturability of the IC associated with portion 10. Regions 43 and 44 and hence extensions 38 and 40 preferably have a concentration of $10^{19}$ to $10^{20}$ dopants per cubic centimeter. Transistor portion 47 can be an N-channel or a P-channel field effect transistor, such as, a metal oxide semiconductor field effect transistor (MOSFET).

Gate structure 46 includes sidewall spacers 42, a metal gate plug 32, a gate conductor 34, and gate oxide 16. Spacers 42 and gate oxide 16 can be an insulating material such as silicon dioxide ($SiO_2$). Preferably, spacers 42 are deposited as a silicon dioxide layer by chemical vapor deposition (CVD), which is selectively etched. Gate oxide 16 is preferably either thermally grown or deposited. Preferably, gate oxide 16 is between 100 and 150 Å thick. Alternatively, spacers 42 can be a silicon nitride material or other insulative material.

Gate structure 46 preferably has a total width (e.g., left to right in FIG.2) including spacers 42 of 100 nm to 250 nm. The width of structure 46 without spacers 42 (the width of plug 32, conductor 34, and oxide 16) is preferably 20 to 100 nm. Gate structure 46 preferably has a thickness of between 800 and 1350 Å.

Preferably, metal gate plug 32 is comprised of TiN, $WSi_2$, or W. However, it should be recognized that any metal or conductive material may be used to form metal plug 32. In addition, it is preferable to form metal plug 32 between 400 and 600 Å thick.

Gate conductor 34 is preferably comprised of a semiconductor material, such as, polysilicon, or polysilicon doped or implanted with another semiconductor material, such as, germanium (Ge). Gate conductor 34 can be doped with an N-type dopant such as phosphorous (P), arsenic (As) or other dopant. Alternatively, gate conductor 34 can be doped with a P-type dopant, such as, boron (B), boron diflouride ($BF_2$) or other dopants. In addition, it is preferable to form gate conductor 34 between 400 and 600 Å thick.

With reference to FIGS. 3–10, the fabrication of transistor 47 is described below as follows. Advantageously, the fabrication process allows very small dimension gate structure 46 to be formed. Significantly, a metal plug, in place of a traditional nitride layer, is used as a hard mask for patterning gate structure 46. The metal plug is formed by deposition followed by polish-back which is independent from any optical lithography process. Thus, because limitations of optical lithography do not apply, a very small linewidth can be formed. The width associated with conductor 34 can be between 10–20 nm. Another advantage is reduction of gate sheet resistance provided by a metal/polysilicon composition of gate structure 46. Reduction of gate sheet resistance is critical in ultra-small dimension devices.

Figure 3:
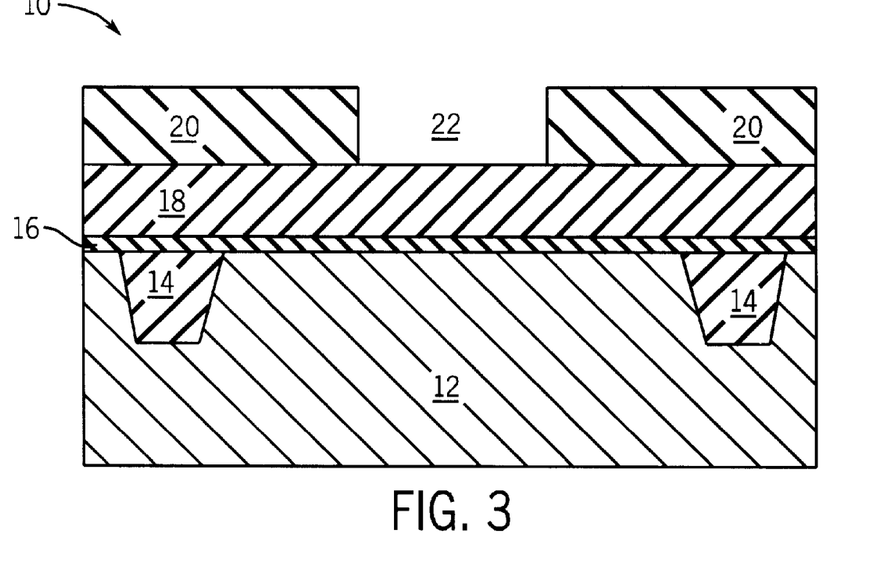
FIG. 3 is a cross-sectional view of the portion of an integrated circuit, illustrated in FIG. 2, showing a pattern defined in a photoresist layer over the integrated circuit portion.

Referring to FIG. 3, conventional semiconductor processes can be utilized to form portion 10 as illustrated. Specifically, shallow trench isolation structures 14 within substrate 12 of portion 10 are formed. Preferably, structures 14 are 2 micrometers apart from each other.

Next, continuing with conventional techniques, a thin oxide layer 16 between approximately 100 and 150 Å thick is deposited by CVD, followed by deposition by CVD of a thick nitride layer 18 between approximately 600 and 1000 Å thick. Next, a photolithography step is performed to open a relatively wide window 22 in a photoresist layer 20. Wide window 22 is between 800 and 1200 Å wide above a desired transistor active area and is preferably centered between structures 14.

Figure 4:
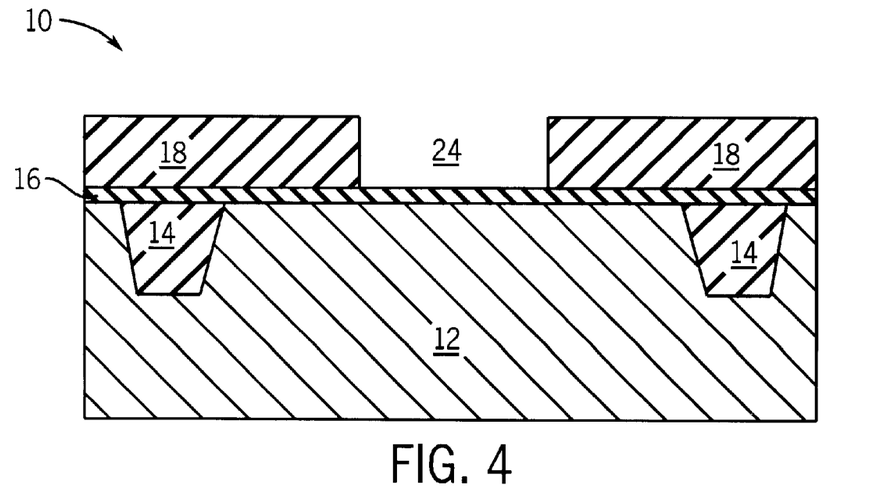
FIG. 4 is a cross-sectional view of the portion of the integrated circuit illustrated in FIG. 3, showing nitride layer removal according to the pattern shown in FIG. 3.

Referring now to FIG. 4, a dry plasma etch is performed to etch away nitride layer 18 according to window 22 of FIG. 3. Further, a conventional etch is utilized to remove oxide 16 in window 22 of FIG. 3. After etching, a window 24 is opened in nitride layer 18 and oxide layer 16. Following formation of window 24, remaining portions of photoresist layer 20 (see FIG. 3) are stripped using any stripping method known in the art. Next, a thermal oxidation process is used to re-grow an oxide layer on substrate 12 according to window 24 as shown in FIG. 4. Preferably, the re-grown oxide layer is less than 150 Å thick. After stripping photoresist 20 and thermal oxidation, portion 10 exists as illustrated in FIG. 4. While a dry plasma etch is preferable for opening window 24, it should be noted that any method of etching to remove nitride layer 18 can be used.

Figure 5:
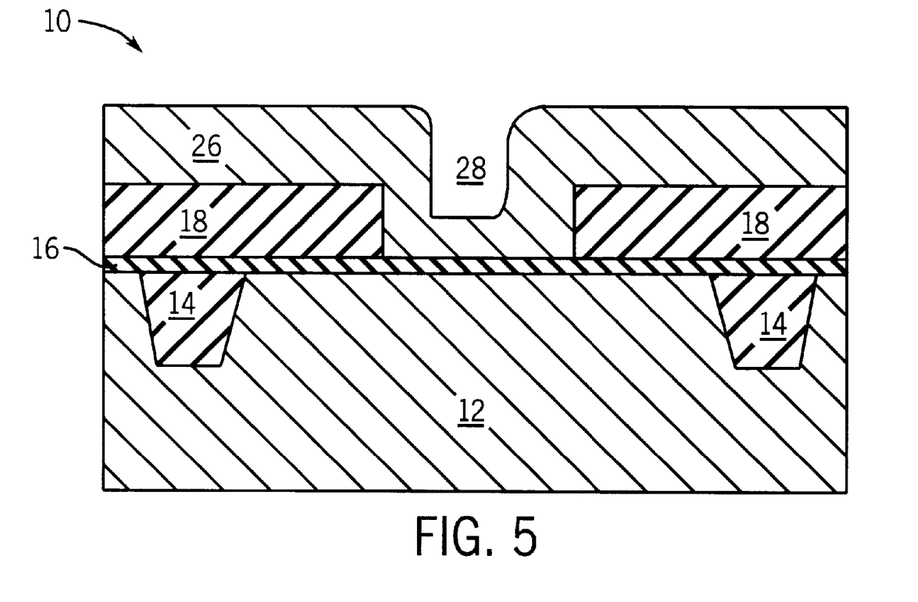
FIG. 5 is a cross-sectional view of the portion of the integrated circuit illustrated in FIG. 4, showing deposition of a polysilicon layer.

Referring now to FIG. 5, a highly conformal polysilicon layer 26 is deposited using low pressure chemical vapor deposition (LPCVD). Alternatively, any method of forming a conformal layer can be used. Polysilicon layer 26 can be heavily doped with an N-type dopant such as phosphorous (P), arsenic (As) or other dopant. Alternatively, polysilicon layer 26 can be doped with a P-type dopant, such as, boron (B), boron diflouride (BF2) or other dopants. Polysilicon layer 26 is highly conformal and preferably formed 400 to 600 Å thick, such that the step coverage forms a trench 28 in window 24 of FIG. 4. Trench 28 is preferably very narrow (e.g., 20 to 100 nm) and 400 to 1000 Å deep.

Figure 6:
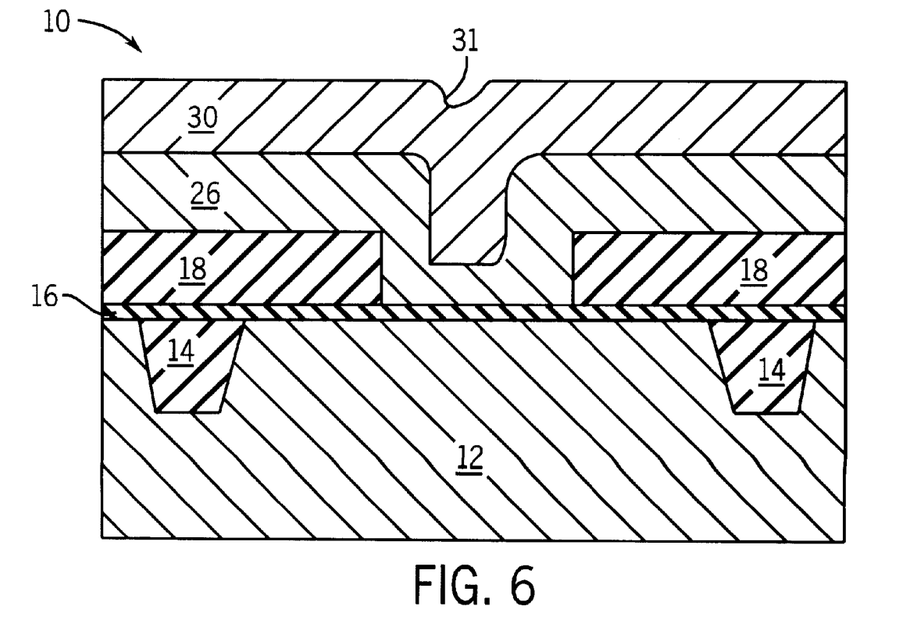
FIG. 6 is a cross-sectional view of the portion of the integrated circuit illustrated in FIG. 5, showing deposition of a metal layer.

Referring now to FIG. 6, a metal layer 30 (indicated by stippled area on FIG. 6) is formed over polysilicon layer 26. Metal layer 30 can be comprised of any refractory metal or other conductive material, such as Pt, Cu, Al, TiN, $WSi_2$, or W. Preferably, metal layer 30 is comprised of TiN, $WSi_2$, or W. Preferably, metal layer 30 is deposited by CVD at a thickness of 1000 to 1200 Å. After deposition, metal layer 30 fills trench 28 (see FIG. 5). Other methods for providing layer 30 can be utilized. Metal layer 30 can have an indent area 31.

Figure 7:
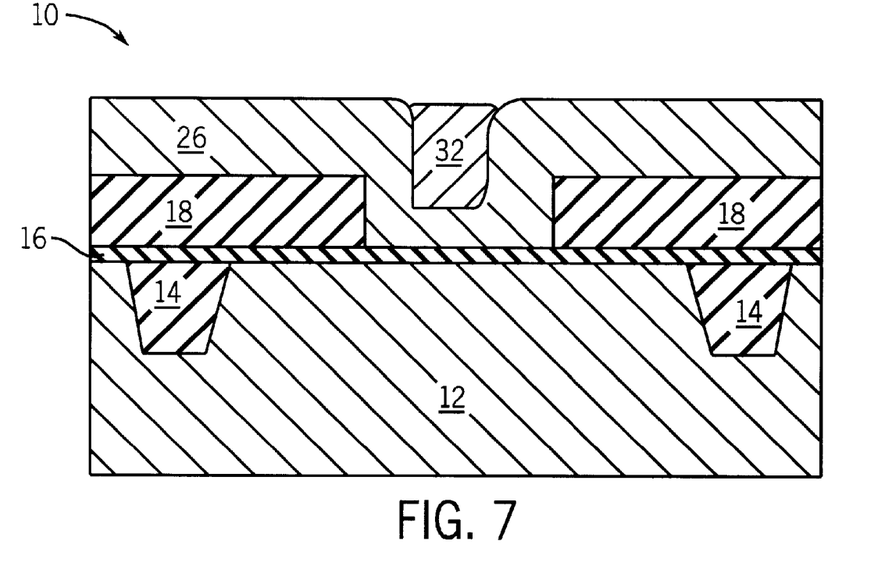
FIG. 7 is a cross-sectional view of the portion of the circuit illustrated in FIG. 6, showing a chemical mechanical polish step.

After depositing metal layer 30, a chemical-mechanical polish (CMP) is applied to portion 10 to remove metal layer 30 above polysilicon layer 26. Referring now to FIG. 7, the CMP is continued until only metal plug 32 (indicated by stippling on FIGS. 2, 7–11) remains of metal layer 30 (see FIG. 6). After the CMP, portion 10 appears as illustrated in FIG. 7 with metal plug 32 in place. Advantageously, metal plug 32: (1) remains and serves as a hard mask during subsequent processing steps, and (2) has a smaller width than is possible by conventional photolithographic techniques. The small width of plug 32 allows transistor portion 47 to be smaller.

Figure 8:
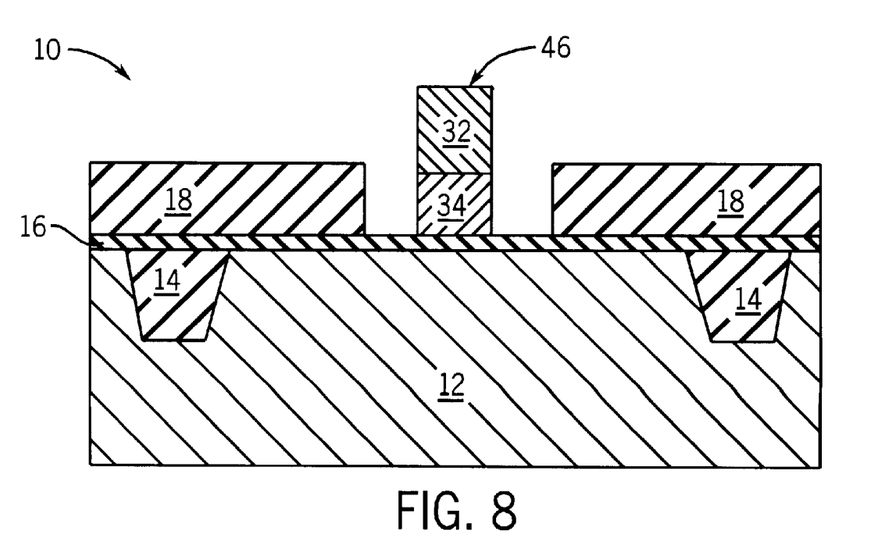
FIG. 8 is a cross-sectional view of the portion of the integrated circuit illustrated in FIG. 7, showing removal of the polysilicon layer.

With metal plug 32 in place, a dry plasma etch is performed to remove portions of polysilicon layer 26 which are not covered by metal plug 32. After removal of polysilicon layer 26, portion 10 appears as illustrated in FIG. 8. Specifically, gate structure 46 comprised of metal plug 32, gate conductor 34 and gate oxide 16, exists above substrate 12 and between insulative structures 14. Advantageously, dimensions of gate structure 46 are defined by dimensions of metal plug 32. As the dimensions of metal plug 32 are not limited by conventional optical lithography techniques, the dimensions of gate structure 46 are not limited by optical lithography techniques.

The width of plug 32 can be controlled by controlling the width of window 22, the thickness of layer 26, and the thickness of layer 18. The width of plug 32 controls the width of structure 46.

Figure 9:
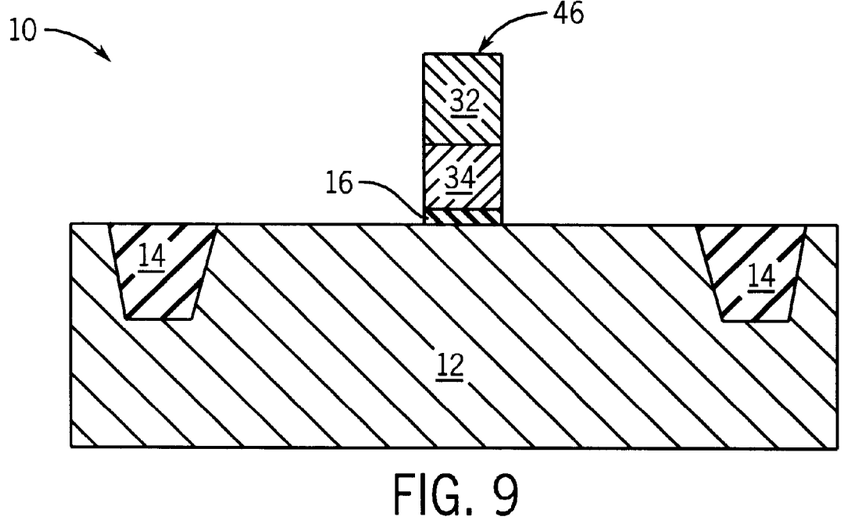
FIG. 9 is a cross-sectional view of the portion of the integrated circuit illustrated in FIG. 8, showing removal of the nitride layer.

With gate structure 46 formed, remaining portions of nitride layer 18 and excess portions of oxide layer 16 can be removed. Preferably, a dry plasma etch is performed to remove the remaining portions of nitride layer 18. While a dry plasma etch is preferable, any method of removal, including a wet etch highly selective to nitride, can be used. Following removal of nitride layer 18, a dry plasma etch is used to remove portions of the oxide layer 16 not covered by gate structure 46. Thus, after removal of both nitride layer 18 and oxide layer 16, gate structure 46, comprised of a metal/polysilicon/oxide gate stack exists above substrate 12 as illustrated in FIG. 9.

Figure 10:
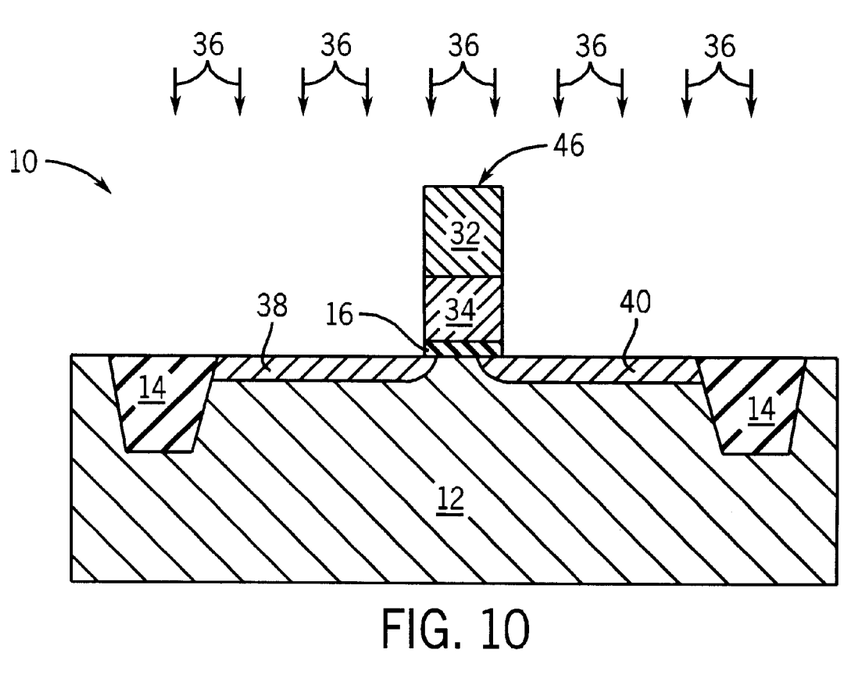
FIG. 10 is a cross-sectional view of the portion of the integrated circuit illustrated in FIG. 9, showing a shallow extension region implant.

After formation of gate structure 46, conventional CMOS processing steps can be followed to complete fabrication of transistor 47. For example, as shown in FIG. 10, an ion implant (e.g., Lightly Doped Drain, (LDD implant)) can be performed to form shallow extension regions 38 and 40. Preferably, substrate 12 is subjected to a dopant 36 implant under separate photolithographic masks for the P-channel and N-channel transistors. The dopant implant can be arsenic (As), boron difluoride ($BF_2$), indium (In), phosphorous (P), or any appropriate dopant for semiconductor fabrication operations. Implantation can be performed by implantation devices manufactured by companies, such as, Varian Company of Palo Alta, Calif., Genius Company, and Applied Materials, Inc. The implantation serves to dope source and drain extension regions, 38 and 40 respectively.

Figure 11:
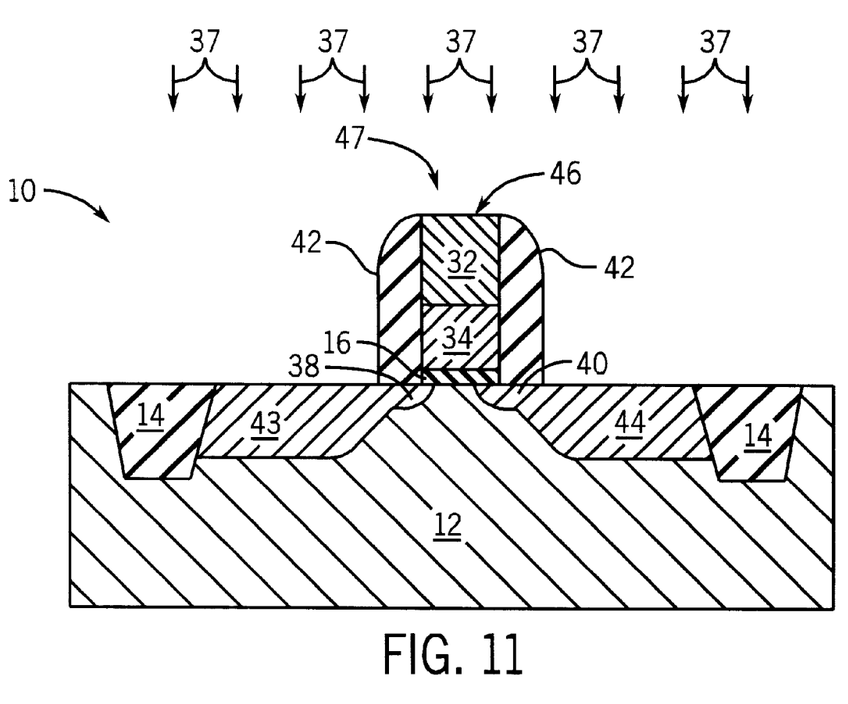
FIG. 11 is a cross-sectional view of the portion of the integrated circuit illustrated in FIG. 10, showing the source and drain region implant.

Another conventional processing step is illustrated in FIG. 11 where sidewall spacers 42 are formed according to a conventional deposition and etch back technique. Spacers 42 abut gate structure 46, are preferably composed of insulating material such as $SiO_2$, and are formed to a width defined by the desired width of source and drain extension regions 38 and 40 as illustrated in FIG. 11. After formation of sidewall spacers 42, substrate 12 is subjected a dopant 37 implant under separate masks (one for N-channel and one for P-channel transistors). The dopant implant is similar to the dopant implant discussed with reference to FIG. 10. This dopant implant serves to form source region 43 and drain region 44 as shown in FIG. 11. In addition to forming source 43 and drain 44 regions, portion 10 can be subjected to additional processing steps (not illustrated) to build transistors, form contacts, and form interconnects.

It is understood that, while preferred embodiments, examples, materials, and values are given, they are for the purpose of illustration only. The apparatus and method of the invention are not limited to the precise details and conditions disclosed. For example, although dry plasma etching techniques are discussed, other methods could be utilized to remove structures. Thus, changes may be made to the details disclosed without departing from the spirit of the invention, which is defined by the following claims.

What is claimed is:

1. A method of manufacturing an integrated circuit, comprising:

providing a semiconductor substrate;

providing a patterned layer over the substrate including at least one pattern aperture, whereby the pattern aperture defines at least part of an active area of the substrate;

forming a first material over the patterned layer, wherein the pattern aperture is partially filled with the first material and a trench is formed in the first material that corresponds to the location of the pattern aperture;

forming a second material over the first material, wherein the second material is a metal material, wherein a plug is formed where the second material substantially fills the trench; and removing a portion of the second material, wherein the plug remains in the trench, whereby the plug provides a hard mask for a gate conductor, the gate conductor including the first material and the plug.

2. The method of claim 1 further comprising:

removing a portion of the first material, wherein the first material remains below the plug.

3. The method of claim 2, wherein the first material is polysilicon.

4. The method of claim 3, wherein the polysilicon is doped with either a P-type dopant or an N-type dopant.

5. The method of claim 4, wherein the polysilicon is doped with any of phosphorous (P), arsenic (As), boron (B), or boron diflouride ($BF_2$).

6. The method of claim 2, wherein the second material includes titanium or tungsten.

7. The method of claim 6, wherein the metal is any of TiN, $WSi_2$, or W.

8. The method of claim 2, wherein the removing the second material step includes a chemical-mechanical polish.

9. The method of claim 2, wherein the removing the first material step includes a dry plasma etch.

10. The method of claim 2, wherein the pattern aperture is between 800 and 1200 angstroms wide.

11. The method of claim 2, wherein the first material is formed between 400 and 600 angstroms thick.

12. The method of claim 2, wherein the second material is formed between 1000 and 1200 angstroms thick.

13. A method of forming a gate structure for a transistor on an integrated circuit, the method comprising:

providing a semiconductor substrate;

providing a first material disposed over the substrate, wherein the first material includes a trench;

substantially filling the trench with a second material to form a plug, whereby the plug provides a non-insulative hard mask; and removing a portion of the first material, wherein the first material remains below the plug, whereby a gate structure including the plug and the first material is formed over the substrate.

14. The method of claim 13, wherein the first material is polysilicon.

15. The method of claim 14, wherein the polysilicon is doped with either a P-type dopant or an N-type dopant.

16. The method of claim 13, wherein the plug is comprised of a metal.

17. The method of claim 16, wherein the metal includes any of TiN, $WSi_2$, or W.

18. The method of claim 14, wherein the gate structure has a width of less than 30 nm.

19. A method of forming a gate structure for a transistor on an integrated circuit on a semiconductor substrate, the gate structure having a gate width less than a lithographic feature, the method comprising:

providing an aperture in a first material disposed above the substrate, the aperture having a width of approximately the lithographic feature;

conformally depositing the second material in the aperture, the second material having a second aperture;

conformally depositing a third material within the second aperture;

removing the third material to leave a plug in the second aperture; and removing the second material using the plug as a non-insulative hard mask, wherein the second material remains below the plug, whereby a gate structure including the plug and the second material is formed over the substrate.

20. The method of claim 19, wherein the second material is polysilicon and the third material is a metal.

* * * * *